United States Patent
Urrutia et al.

(10) Patent No.: US 12,316,273 B2
(45) Date of Patent: *May 27, 2025

(54) SOLAR ENERGY SYSTEM FOR USE WITH TUFTED GEOSYNTHETICS

(71) Applicant: Watershed Geosynthetics LLC, Alpharetta, GA (US)

(72) Inventors: Jose Urrutia, Suwanee, GA (US); Michael R Ayers, Johns Creek, GA (US); Michael Lucini, Somerville, MA (US); Gregory Lucini, Berkley, MA (US)

(73) Assignee: Watershed Geosynthetics LLC, Alpharetta, GA (US)

( * ) Notice: Subject to any disclaimer, the term of this patent is extended or adjusted under 35 U.S.C. 154(b) by 872 days.

This patent is subject to a terminal disclaimer.

(21) Appl. No.: 16/990,729

(22) Filed: Aug. 11, 2020

(65) Prior Publication Data

US 2021/0126578 A1   Apr. 29, 2021

Related U.S. Application Data

(63) Continuation of application No. 16/750,806, filed on Jan. 23, 2020, now Pat. No. 10,742,164, which is a
(Continued)

(51) Int. Cl.
*H02S 40/22* (2014.01)
*E01C 13/08* (2006.01)
(Continued)

(52) U.S. Cl.
CPC .............. *H02S 40/22* (2014.12); *E01C 13/08* (2013.01); *H02J 3/38* (2013.01); *H02J 3/381* (2013.01);
(Continued)

(58) Field of Classification Search
CPC .......... H02S 40/22; H02S 20/10; H02S 30/10; H02S 40/34; E01C 13/08; H02J 3/38;
(Continued)

(56) References Cited

U.S. PATENT DOCUMENTS

| 4,226,256 A | 10/1980 | Hawley |
| 5,990,413 A | 11/1999 | Ortabasi |

(Continued)

FOREIGN PATENT DOCUMENTS

| CN | 103119728 A | 5/2013 |
| CN | 104145421 | 11/2014 |
| WO | 2011139660 | 11/2011 |

OTHER PUBLICATIONS

Grace, Melissa. Landfill Turned into Solar-Powered Generation Facility. Landfill Technologies. Mar. 1-20/Apr. 2015 [retrieved on May 6, 2018]. Retrieved from the Internet: URL: http://agruamerica.com/wp-content/uploads/2015/07 /Landfill-Turned-Into-Solar-Powered Final .pdf. See p. 8 of the ISN237.
(Continued)

*Primary Examiner* — Omar F Hijaz
(74) *Attorney, Agent, or Firm* — Baker Donelson; Carl M. Davis, II

(57) ABSTRACT

A solar energy system for use with tufted geosynthetics on a substantially flat surface having a racking structure with bases and attachments for frictional seating to a tufted geosynthetic ground cover system, a bifacial solar panel mounted to the racking system and electrically connected to a connection box for communicating electrical current to an electricity power conditioner of an electrical current grid generated upon exposure of the solar panel to ambient light. A method of using a solar energy system with tufted geosynthetics cover system is disclosed.

19 Claims, 4 Drawing Sheets

Related U.S. Application Data continuation of application No. 15/921,213, filed on Mar. 14, 2018, now Pat. No. 10,581,374.

(60) Provisional application No. 62/470,914, filed on Mar. 14, 2017.

(51) Int. Cl.
| | | |
|---|---|---|
| *H02J 3/38* | (2006.01) | |
| *H02S 20/10* | (2014.01) | |
| *H02S 30/10* | (2014.01) | |
| *H02S 40/34* | (2014.01) | |
| *H10F 10/14* | (2025.01) | |

(52) U.S. Cl.
CPC .............. *H02S 20/10* (2014.12); *H02S 30/10* (2014.12); *H02J 2300/24* (2020.01); *H02S 40/34* (2014.12); *H10F 10/148* (2025.01); *Y02E 10/52* (2013.01)

(58) Field of Classification Search
CPC ... H02J 3/381; H02J 2300/24; H01L 31/0684; Y02E 10/52; Y02E 10/50; Y02E 10/547; Y02E 10/56
See application file for complete search history.

(56) References Cited

U.S. PATENT DOCUMENTS

| | | | |
|---|---|---|---|
| 7,682,105 B2 | 3/2010 | Ayers et al. | |
| 8,403,597 B2 | 3/2013 | Ayers et al. | |
| 8,413,391 B2 * | 4/2013 | Seery ....................... | F24S 25/70 52/173.3 |
| 8,585,322 B2 | 11/2013 | Ayers et al. | |
| 8,832,938 B2 * | 9/2014 | Gies ........................ | F24S 25/30 52/173.3 |
| 9,010,042 B2 * | 4/2015 | Anderson ............. | H01L 31/042 52/173.3 |
| 9,136,792 B2 | 9/2015 | Tomlinson | |
| 9,163,375 B2 | 10/2015 | Ayers et al. | |
| 9,199,287 B2 | 12/2015 | Lewis et al. | |
| 9,324,892 B2 * | 4/2016 | Powrozek ............... | H02S 20/00 |
| 9,537,033 B2 | 1/2017 | Langmaid | |
| 9,587,364 B2 | 3/2017 | Ayers et al. | |
| 9,628,019 B1 | 4/2017 | Atcha et al. | |
| 9,874,006 B1 * | 1/2018 | Mattana ................... | H02S 20/00 |
| 10,171,027 B2 * | 1/2019 | Wares ...................... | F24S 25/20 |
| 10,243,505 B1 | 3/2019 | Kurtz et al. | |
| 11,336,221 B2 * | 5/2022 | Truthseeker ............. | H02S 20/24 |
| 2008/0069642 A1 * | 3/2008 | Ayers ....................... | B09B 1/004 405/129.45 |
| 2010/0248868 A1 * | 9/2010 | Massaro ............. | A63B 69/0013 473/497 |
| 2011/0194900 A1 * | 8/2011 | French, Sr. ............ | F24S 25/617 104/106 |
| 2011/0197524 A1 | 8/2011 | Sahlin et al. | |
| 2011/0277296 A1 * | 11/2011 | Ramos ...................... | F24S 25/65 29/428 |
| 2011/0277806 A1 | 11/2011 | Gillenwater | |
| 2012/0266944 A1 | 10/2012 | Wildes | |
| 2013/0276867 A1 | 10/2013 | Wildes et al. | |
| 2013/0299655 A1 | 11/2013 | Sader | |
| 2014/0083028 A1 | 3/2014 | Richardson | |
| 2014/0290720 A1 | 10/2014 | Hockaday | |
| 2015/0040969 A1 * | 2/2015 | Wildes ..................... | H02S 20/10 136/251 |
| 2015/0118418 A1 | 4/2015 | Cooley et al. | |
| 2015/0331972 A1 * | 11/2015 | McClure ................ | G06F 17/11 703/2 |
| 2016/0336895 A1 | 11/2016 | Wildes et al. | |
| 2017/0233956 A1 | 8/2017 | Hanson, Jr. | |
| 2018/0131316 A1 | 5/2018 | Urrutia et al. | |
| 2018/0191296 A1 | 7/2018 | Lehmann | |
| 2019/0056149 A1 | 2/2019 | Thomson | |

OTHER PUBLICATIONS

International Search Report, PCT/US2017/060883 (dated Jan. 17, 2018), 1 page, The International Bureau of WIPO, Geneva, Switzerland.

International Search Report for PCT/US2018/022435 dated Jun. 15, 2018.

Written Opinion of the International Searching Authority for PCT/US2018/022435 dated Jun. 15, 2018.

Written Opinion, PCT/US2017/060883 (dated Jan. 17, 2018), 4 pages, The International Bureau of WIPO, Geneva, Switzerland.

\* cited by examiner

SOLAR ENERGY SYSTEM FOR USE WITH TUFTED GEOSYNTHETICS

CROSS REFERENCE TO RELATED APPLICATIONS

This application claims benefit of U.S. Provisional Patent Application Ser. No. 62/470,914, filed Mar. 14, 2017.

TECHNICAL FIELD

This invention relates to a solar energy system. In a more specific aspect, this invention relates to a solar energy system for use with tufted geosynthetics on a substantially flat surface.

In this application, the following terms will be understood to have the indicated definitions.

- "tufted geosynthetics"—a cover system which is generally comprised of synthetic grass having synthetic fibers tufted to a backing and a geomembrane and which is adapted to cover waste sites and other environmental closures. Examples of a tufted geosynthetic cover system are shown in Ayers and Urrutia U.S. Pat. Nos. 7,682,105 and 9,163,375. The term "tufted geosynthetics" is also used to refer to a synthetic turf cover system.
- "synthetic grass"—refers to a composite which comprises at least one geotextile (woven or nonwoven) tufted with one or more synthetic yarns or strands and which has the appearance of grass.
- "geomembrane"—refers to a textured polymeric material, such as high density polyethylene, very low density polyethylene, linear low density polyethylene, polyvinyl chloride, etc.
- "substantially flat surface"—refers to a surface which has an angle of slope of no more than 20.0 percent. Examples of a substantially flat surface are the surfaces of a roof, building, ground or other surface.

BACKGROUND OF THE INVENTION

Solar energy systems have been used over various surfaces, such as soil, parking lots, rooftops and the tops of other structures. Those systems include racking structures which are designed for their particular uses, such as the racking structure disclosed in Ramos U.S. Pat. No. 8,984,751.

However, there is a need in the solar energy industry for a new and improved solar energy system which can be mounted over tufted geosynthetics on a substantially flat surface. The new and improved solar energy system of this invention may leverage the unique aspects of the mounting surface to increase performance characteristics of the system and/or reduce costs of the system compared to the prior systems.

It is to such that the present invention is directed.

SUMMARY OF THE INVENTION

Briefly described, the present invention meets the need in the art by providing a solar energy-generating apparatus for frictionally engaging to a tufted geosynthetics ground cover system covering an area of ground, comprising a tufted ground cover system comprising at least one geotextile having a plurality of spaced apart tufts extending therefrom, said tufts tufted with one or more synthetic yarns, for covering an area of ground and a racking system having a plurality of spaced-apart bases, each base having a plurality of projecting stub, finger, or barb attachments for frictional engaging of the respective base in connection with a portion of the tufted geosynthetic ground cover system. At least one solar panel for mounting to the racking system at an oblique angle relative to the tufted geosynthetic ground cover system for generating electrical current upon exposure to an ambient sunlight. A connection box for electrically coupling with the at least one solar panel for communicating electrical current generated by the solar panel to an electricity power conditioner of an electrical current grid. The electrical power being generated by the solar panel upon exposure to ambient light for supply to the electrical current grid while the projecting stub, finger, or barb attachments frictionally engaged within the tufts secure the racking system to the tufted ground cover system and resist wind uplift.

In another aspect, the present invention provides a method for generating energy with a solar energy-generating system attached to tufted geosynthetics ground cover system covering an area of ground, comprising the steps of:

(a) seating a racking system with a portion of a tufted geosynthetic ground cover system, said racking system having a plurality of bases and each base comprising a footing having a plastic coating material and a pad having a plurality of projecting stub, finger, or barb attachments extending therefrom for frictional seating of the respective base with the tufted geosynthetic ground cover system and a connecting member extending from the footing to a free distal end for supporting at least one of the solar panels,, said tufted geosynthetic ground cover system comprising at least one geotextile having a plurality of spaced apart tufts extending therefrom, said tufts tufted with one or more synthetic yarns as simulated blades of grass;

(b) mounting at least one solar panel to said connecting of the racking system at an oblique angle relative to the tufted geosynthetic ground cover system, the solar panel having a first solar energy surface facing upwardly for generating electrical current upon exposure to an ambient sunlight; and (c) electrically coupling the at least one solar panel with a connection box for communicating electrical current generated by the solar panel upon exposure to ambient sunlight to an electricity power conditioner of an electrical current grid, whereby electrical power being generated by the solar panel upon exposure to ambient light is supplied to the electrical current grid while the projecting stub, finger, or barb attachments being frictionally engaged within the tufts secures the racking system to the tufted geosynthetic ground cover.

Briefly, the present invention provides a new and improved solar energy system to be mounted (i.e., installed) over tufted geosynthetics on a substantially flat surface.

The solar energy system of this invention provides at least two principal advantages.

A first advantage is the ability of the system to provide increased reflectivity of the mounting surface. The use of bifacial solar panels to absorb light on their front and back sides will generate additional energy for use.

A second advantage is the increased friction between the mounting surface and a ballasted racking structure. The increased friction reduces the amount of ballast used to achieve system design parameters for a given location for the system.

Objects, features, and advantages of the present invention will become apparent upon a reading of the following detailed description in conjunction with the drawings and the appended claims.

DETAILED DESCRIPTION

The present invention provides a solar energy system 40 for use with a tufted geosynthetic cover system 10 on a substantially flat surface with a racking structure 5.

Figure 1:
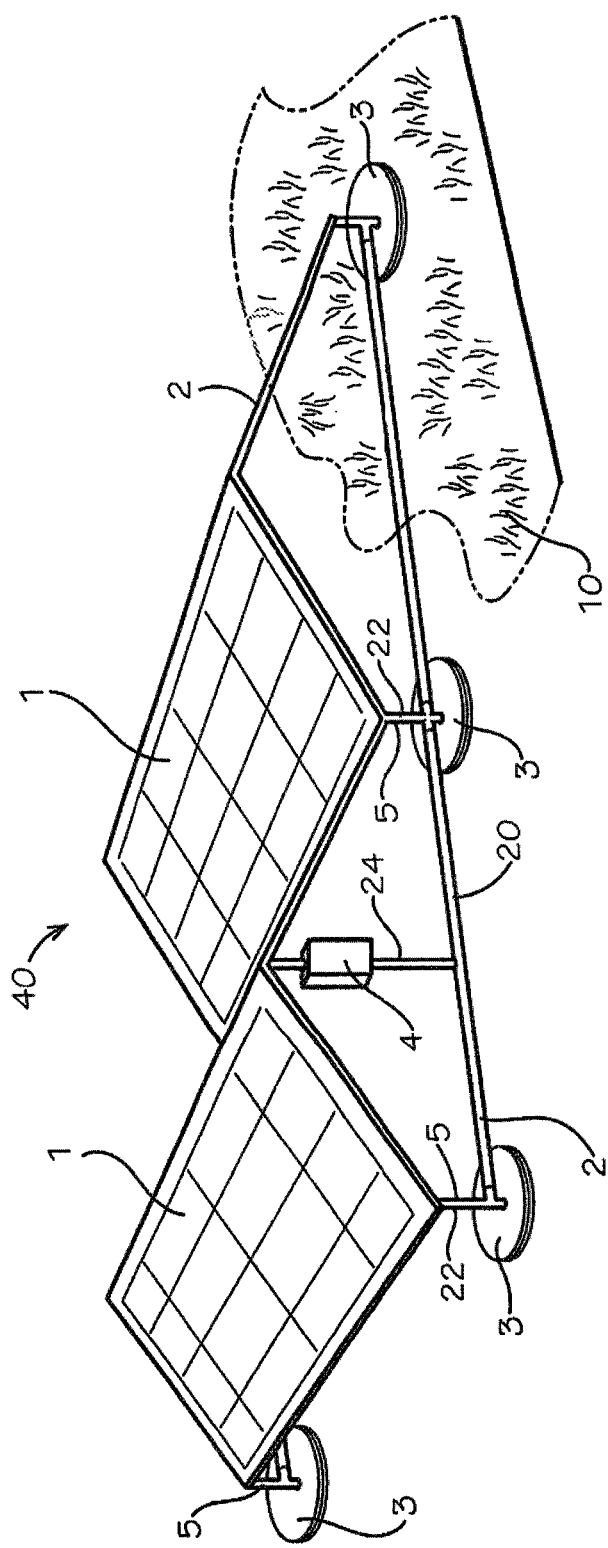
FIG. 1 is a view of an embodiment of the solar energy system of this invention, which shows an arrangement of multiple solar panels and a racking structure.

With reference to the drawings, in which like parts have like identifiers, FIG. 1 illustrates an embodiment of the solar energy system 40 in accordance with the present invention, which drawing illustrates the embodiment having an arrangement of multiple solar panels 1 and a racking structure generally 2. The principal components of embodiments of this invention are a tufted geosynthetic cover system 10, at least one solar energy panel 1, and the racking structure 2.

Cover System

Examples of tufted geosynthetic cover systems useful in the solar energy system of this invention are the cover systems marketed by Watershed Geosynthetics LLC (Alpharetta, Ga.) under registered trademarks such as ClosureTurf and VersaCap. These covers comprise a composite of at least one geotextile mat 33 tufted with one or more synthetic yarns (i.e., a tufted geosynthetic) and an impermeable geomembrane 35 comprised of a polymeric material.

Figure 2:
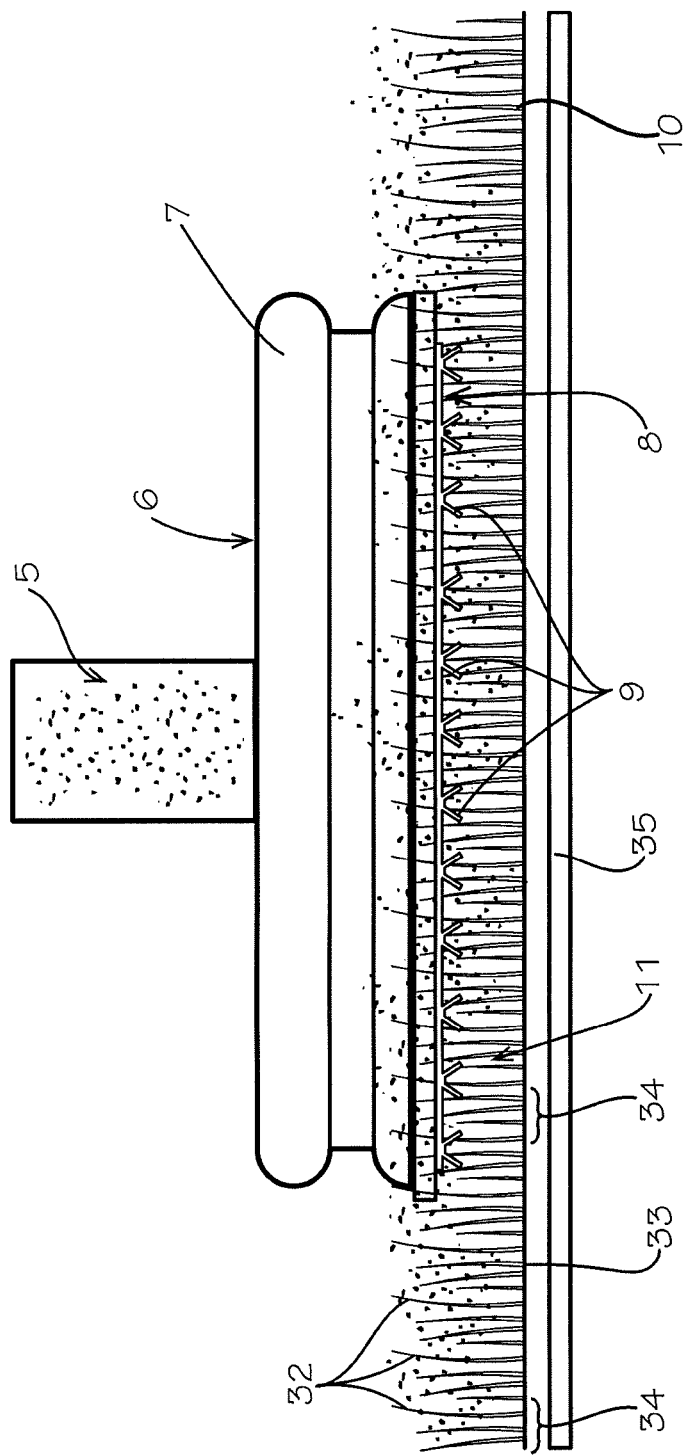
FIG. 2 is a cross-section of an embodiment of the solar energy system of this invention, which shows the ballasted base of the racking structure with a tufted geosynthetic cover system.

With reference to FIG. 2, the ground cover system 10 includes an array or mass of synthetic slender blades 32 incorporated into and extending from the upper side of a geotextile mat 33 as a plurality of spaced-apart tufts 34. The synthetic blades 32 may be formed by any conventional means such as tufting of yarns through the mat or weaving tufts or lines of tufts of synthetic fibers or yarn into the mat. The tufting involves knitting the yarns through the mat with running tuft bridges on a bottom side. The tufting thereby defines the adjacent tufts 34 in a field of spaced-apart tufts. The synthetic strands 32 extend upwardly from the base mat as a field of such strands to simulate a aesthetically suitable field of grass, pine straw or similar Optionally, the synthetic grass blades 32 are tufted to have a density of between about 5 ounces/square yard and about 60 ounces/square yard. Preferably, the synthetic grass blades have a density of between about 10 and 40 ounces/square yard. The tufting is fairly homogeneous. In general, a "loop" is inserted at a gauge spacing to achieve the desired density. For example, each loop may be two blades of grass at each tufted location. Preferably, the synthetic grass blades 32 have a thickness of at least about 50 microns. The bottom side of the mat may include a stabilizer portion to secure the tufts, such as heat bonding, adhesive, spray-upon polypropylene, polyethylene or polymerizing vinyl chloride (PVC), or the like.

The synthetic grass of the geosynthetic cover system may contain an infill material and/or a material for protection of the synthetic grass against ultraviolet rays, surface water flow or concentrated water flow falling from the solar panels. The infill material may be specialized to increase reflectance and/or to cool the temperature of the synthetic grass surface to increase the collection efficiency of the solar energy system.

When used in the solar energy system of this invention, suitable infill materials (shown as 11 in FIGS. 2 and 3) include sand, concrete and materials available from Watershed Geosynthetics LLC under trademarks such as HydroBinder and ArmorFill. The infill materials can be of various colors, sizes, weights and textures.

Solar Panel

One or more solar panels 1 can be used in the solar energy system of this invention, such as commercially available crystalline silicon solar panels, and more preferably a bifacial solar panel for receiving ambient sunlight from around and below the solar panel for increased generation capacity. An example of an effective solar panel is available from Prism Solar Technologies (Highland, N.Y.) under the trademark Bi 60.

With continued reference to the drawings, FIG. 1 shows a preferred embodiment of this invention with a plurality of solar panels 1 mounted on a racking structure 2 that is supported by a plurality of bases 3. Elongate members 20 extend between a member 5 that extends from a respective base 3. The members 5 are a first support post 22 and a second support post 24. In the illustrated embodiment, the first support posts 22 are of a first length and the second support posts 24 have a second length different from the first length. This enables positioning of the solar panels 1 at an oblique angles relative to the bases 5 for orienting the solar panels at a preferred angle relative to the sun 13 for generation of electricity using ambient sunlight falling on the solar panel. Lateral members (not illustrated) may extend between opposing sides for support and rigidity of the racking structure 2. The second support 24 illustrated in FIG. 2 attaches to the elongate member 20 intermediate the first support posts 5.

A connection box 4 mounts to a member of the racking structure 2. The solar panels 1 connect electrically to the connection box 4 that transmits the solar energy to power conditioning equipment (not shown) for communication with an electrical power grid.

FIG. 2 illustrates in cross-sectional view a preferred embodiment of this invention in the area located under the solar panel 1 (not shown) and comprises the member 5 for connecting to the racking structure (not shown), a footing 6 with a high density polyethylene covering 7 and a pad 8 with attachments 9 for gripping the tufted geosynthetic cover 10. The attachments 9 may comprise a sheet member having a plurality of projecting stubs, fingers, barbs, or similar gripping members for engaging the tufted geosythetic cover 10.

In the illustrated embodiment, the geosynthetic ground cover 10 includes an infill 11.

Figure 3:
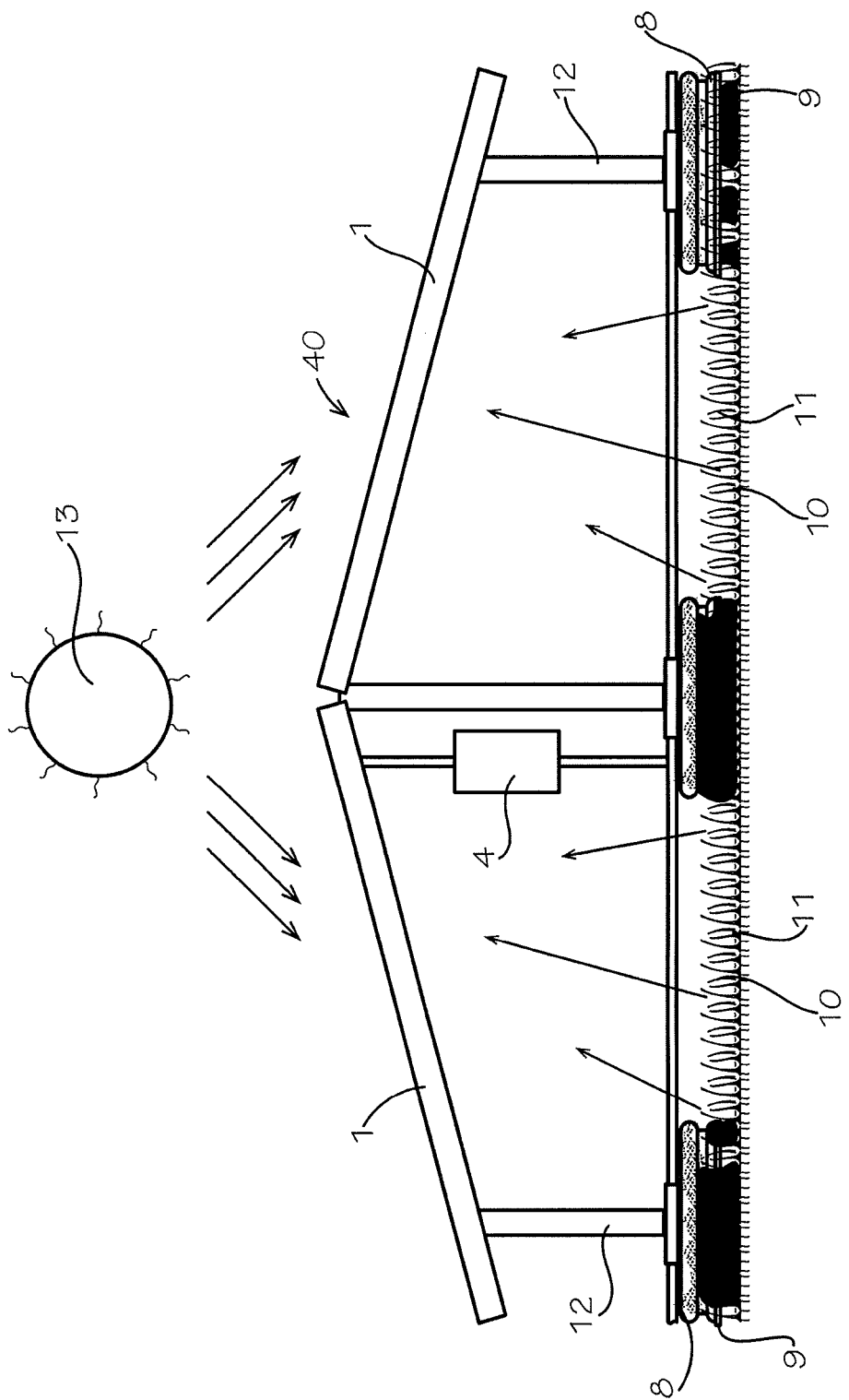
FIG. 3 is a view of a preferred embodiment of the solar energy system of this invention, which shows multiple solar panels, rays of the sun and the resultant reflectivity (arrows) provided by this invention.

FIG. 3 shows a preferred embodiment of this invention in which solar panels 1 are supported by a racking structure 2 located on pads 8 above a tufted geosynthetic cover system 10 having infill 11 and attachments 9. The connection box 4 attaches to a central one of the support posts 5. Sunlight 13 (represented by arrows) is incident directly on the top surfaces of solar panels 1 and reflected by tufted geosynthetic cover system 10 and infill 11 to the undersides of bifacial solar panels 1.

Reflectivity

A principal advantage of this invention is the reflectivity of sunlight by the tufted geosynthetic cover system 10 due to both the texture and color of the cover system.

A bifacial photovoltaic solar panel absorbs light incident on both the front and backside of the panel. Therefore, the panel generates more power than a conventional, front-side only panel of equal size (i.e., a non-bifacial solar panel).

The front side of the solar panels 1 is considered to be facing the sun, while the backside is facing the surface over which the solar panel is mounted. Direct and diffuse solar reflection from the mounting surface both contribute to backside irradiance. The amount of additional energy harvested from a bifacial vs. conventional panel is dependent on the mounted surface reflectance, particularly in the infrared and near-infrared wavelengths absorbed by the panel.

A popular commercial application for bifacial solar panels is on white cool roofs, which can have a total surface reflectance of 65-90%. This is associated with a 15-25% increase in total system energy production depending on system design parameters such as roof clearance and the angle of slope.

For a synthetic turf environmental closure, the cover system may be modified to increase surface reflectance and, therefore, increase bifacial system energy production. The use of white turf and/or a specialized reflective infill will increase surface reflectance due to the color and texture of the infill The infill 11 is granular materials or powders preferably light reflective. Reflectivity arises from the surface particularly as a light reflective color or in an alternate embodiment in which the infill is faceted particles, crystals, or mirroring surfaced materials. Such infill includes but is not limited to sand, silica particles, and intermixed quartz particles.

Friction

This invention provides a method for a ballasted racking structure to be improved when mounted over tufted geosynthetics by increasing the coefficient of friction between the racking structure footing and the mounting surface.

The footing (shown as 6 in FIG. 2) can be a pan or other similar horizontal member that can be loaded with one or more ballast blocks according to the design specifications of the racking structure. This invention introduces pad 8 and attachments 9 which are placed under the footing to grip into the tufted geosynthetic 10 and infill 11.

The solar panel(s) 1 of this system can be used as a single panel or used in an arrangement of two or more panels, depending on the location, availability of the sun, objective of the system, design specifications, etc.

The support (shown as 6 in FIG. 2) can be made of one or more layers to provide adequate support. Examples of suitable support materials include synthetic and other materials such as plastics, cardboard and steel.

Examples of suitable materials for infill (shown as 11 in FIGS. 2 and 3) are sand, concrete and other materials available from Watershed Geosynthetics LLC under the trademarks HydroBinder and ArmorFill. The infill can be of various colors, especially white, to increase reflectivity.

Examples of suitable materials for attachments (shown as 9 in FIG. 2) include products available from Agru America (Georgetown, S.C.) under the trademark SureGrip.

Figure 4:
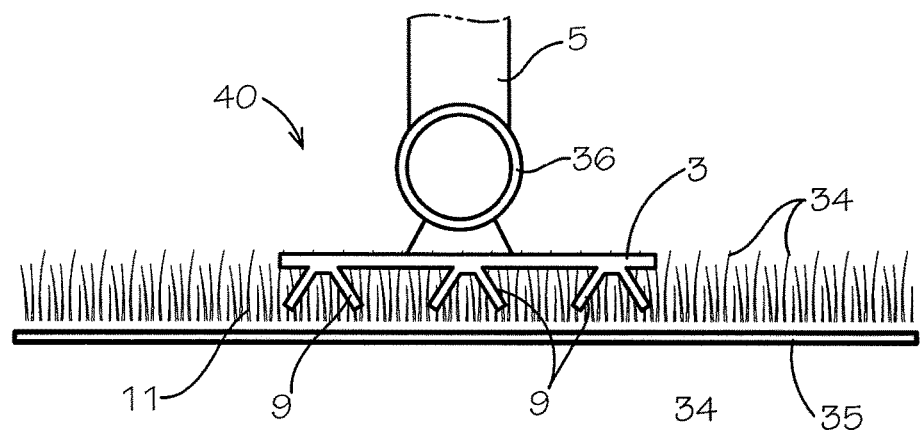
FIG. 4 is a cross-section of an embodiment of the solar energy system of this invention, which shows the ballasted base of the racking structure with a tufted geosynthetic cover system.

FIG. 4 illustrates a detailed cross-section of an embodiment of the solar energy system 40, which shows an embodiment of the base 3 of the racking structure having attachments 9 embedded in the tufts 34 and infill 11 of with a tufted geosynthetic cover system. A conduit 36 extending to other of the bases in the racking system provides an enclosed channel such as for electrical wires from the solar panels 1.

Figure 5:
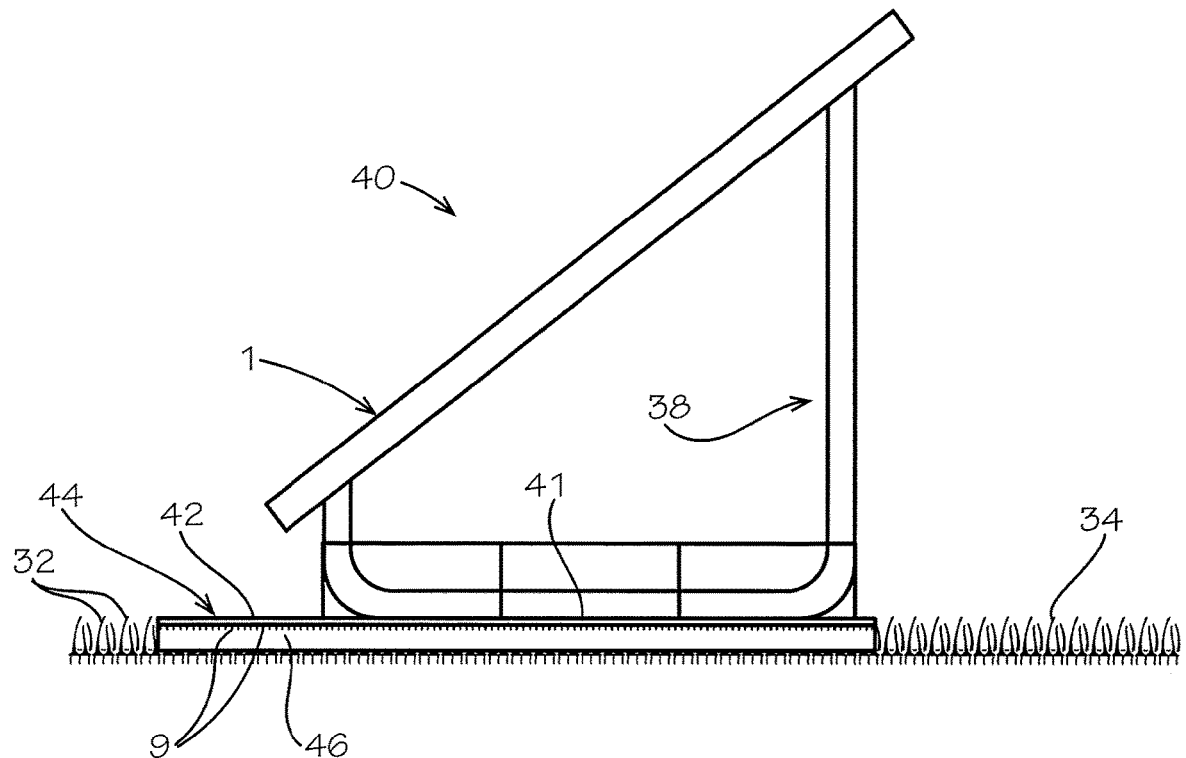
FIG. 5 is a side view of an alternate embodiment of the solar energy system of the present invention for use with a tufted geosynthetic cover system.

FIG. 5 illustrates in side view an alternate embodiment of the solar energy system 40 with a U-shaped racking system 38 having first supports and second supports of different lengths for orienting the solar panel 1 at a preferred angle for generating current from the ambient sunlight. The base 41 is an elongated member from which the attachments 9 extend. The attachments 9 extend from a mat sheet 42 into the infill 11 and the tufts 34 of the tufted geosynthetic cover system 10. As noted at 44, the sheet 42 may extend laterally of perimeter edges of the solar panel 1 for a drip edge. The attachments 9 may seat in a cured pad 46 within the field of tufts 34 or within the particulate infill 11 and gripping of the blades 32 and tufts 34. For example, the cured pad 44 may be a plastics/particulate binder material or a cementitious curable material.

This invention has been described with particular reference to certain embodiments, but variations and modifications can be made without departing from the spirit and scope of the invention set forth in the appended claims.

What is claimed is:

1. A solar energy-generating apparatus for frictionally engaging to a tufted geosynthetics ground cover system covering an area of ground, comprising:

a tufted geosynthetics ground cover system comprising at least one geotextile having a plurality of spaced apart tufts extending therefrom, said tufts tufted with one or more synthetic yarns, for covering an area of ground;

a racking system having a plurality of bases, each base having a plurality of projecting stub, finger, or barb attachments for frictional seating of the respective base in a spaced-apart relation with the projecting stub, finger, or barb attachments frictionally engaging respective tufts of a portion of the tufted geosynthetic ground cover system;

said bases each comprises:

a footing comprises a plastic coating material and a pad from which said plurality of projecting stub, finger, or barb attachments extend; and a connecting member extending from the footing to a free distal end for supporting at least one of the solar panels;

at least one solar panel for mounting to the racking system at an oblique angle relative to the tufted geosynthetic ground cover system, the solar panel having a first solar energy surface for facing upwardly for generating electrical current upon exposure to an ambient sunlight; and a connection box for electrically coupling with the at least one solar panel for communicating electrical current generated by the solar panel to an electricity power conditioner of an electrical current grid, whereby electrical power being generated by the solar panel upon exposure to ambient light is supplied to the electrical current grid while the projecting stub, finger, or barb attachments being frictionally engaged within the tufts secure the racking system to the tufted geosynthetics ground cover system.

2. The solar energy-generating apparatus as recited in claim 1, wherein the solar panel comprises a bifacial solar panel that further comprises an opposing second solar energy surface facing generally downwardly for generating electrical current upon exposure to backside irradiance of ambient sunlight reflected from the tufted geosynthetics ground cover system.

3. The solar energy-generating apparatus as recited in claim 1, further comprising a ballasting infill of a light reflective material.

4. The solar energy-generating apparatus as recited in claim 3, wherein the ballasting infill comprises a granular material of a light reflective color.

5. The solar energy-generating apparatus as recited in claim 3, wherein the ballasting infill comprises a plurality of light-reflecting particles.

6. The solar energy-generating apparatus as recited in claim 3, wherein the ballasting infill comprises a plurality of crystals that reflect light.

7. The solar energy-generating apparatus as recited in claim 3, wherein the ballasting infill provides a cured pad for securely engaging the attachments.

8. The solar energy-generating apparatus as recited in claim 1, wherein the tufted geosynthetic ground cover further comprises an impermeable geomembrane.

9. The solar energy-generating apparatus as recited in claim 1, wherein the geotextile comprises a woven sheet.

10. The solar energy-generating apparatus as recited in claim 8, wherein the geomembrane comprises a polymeric material.

11. The solar energy-generating apparatus as recited in claim 1, wherein the racking system comprises a plurality of elongated members interconnected with at least two of the bases.

12. The solar energy-generating apparatus as recited in claim 11, wherein a support post extends from each of the plurality of bases and mountingly connects at a distal end to the solar panel.

13. A method for generating energy with a solar energy-generating system attached to a tufted geosynthetics ground cover system covering an area of ground, comprising the steps of:
(a) seating a racking system with a portion of a tufted geosynthetic ground cover system, said racking system having a plurality of bases and each base comprising a footing having a plastic coating material and a pad having a plurality of projecting stub, finger, or barb attachments extending therefrom for frictional seating of the respective base with the tufted geosynthetic ground cover system and a connecting member extending from the footing to a free distal end for supporting at least one of the solar panels, said tufted geosynthetic ground cover system comprising at least one geotextile having a plurality of spaced apart tufts extending therefrom, said tufts tufted with one or more synthetic yarns as simulated blades of grass;
(b) mounting at least one solar panel to said connecting member of the racking system at an oblique angle relative to the tufted geosynthetic ground cover system, the solar panel having a first solar energy surface facing upwardly for generating electrical current upon exposure to an ambient sunlight; and
(c) electrically coupling the at least one solar panel with a connection box for communicating electrical current generated by the solar panel upon exposure to ambient sunlight to an electricity power conditioner of an electrical current grid, whereby electrical power being generated by the solar panel upon exposure to ambient light is supplied to the electrical current grid while the projecting stub, finger, or barb attachments being frictionally engaged within the tufts secures the racking system to the tufted geosynthetic ground cover.

14. The method for generating energy as recited in claim 13, wherein the solar panel mounted in step (b) comprises a bifacial solar panel that further comprises an opposing second solar energy surface facing downwardly for generating electrical current upon exposure to a backside irradiance of ambient sunlight reflected from the tufted geosynthetics ground cover.

15. The method for generating energy as recited in claim 14, further comprising the step of distributing within the tufts of the tufted geosynthetics ground cover a ballasting infill of a particulate material.

16. The method for generating energy as recited in claim 15, wherein the ballasting infill comprises a light reflective material.

17. The method for generating energy as recited in claim 13, further comprising the step of distributing within the tufts of the tufted geosynthetics cover system a ballasting infill for engaging the projecting stub, finger, or barb attachments.

18. The method for generating energy as recited in claim 17, wherein the ballasting infill comprises a light reflective material.

19. The method for generating energy as recited in claim 17, wherein the ballasting infill comprises a bonding material for securing to the projecting stub, finger, or barb attachments.

* * * * *